United States Patent [19]

Arendt

[11] Patent Number: 5,043,319
[45] Date of Patent: Aug. 27, 1991

[54] SYNTHESIS OF LANTHANUM-ALKALINE EARTH-COPPER-OXYGEN SUPERCONDUCTIVE MATERIAL

[75] Inventor: Ronald H. Arendt, Schenectady, N.Y.

[73] Assignee: General Electric Company, Schenectady, N.Y.

[21] Appl. No.: 609,136

[22] Filed: Nov. 2, 1990

Related U.S. Application Data

[63] Continuation of Ser. No. 227,840, Aug. 3, 1988, abandoned.

[51] Int. Cl.$^5$ .................... C04B 35/00; C30B 29/22; H01B 13/00; H01L 39/24
[52] U.S. Cl. .......................................... 505/1; 423/593
[58] Field of Search ............................ 505/1; 423/593

[56] References Cited

U.S. PATENT DOCUMENTS

| | | | |
|---|---|---|---|
| 4,152,280 | 5/1979 | Arendt et al. | 252/62.9 |
| 4,152,281 | 5/1979 | Arendt et al. | 252/62.9 |
| 4,201,760 | 5/1980 | Arendt et al. | 423/600 |
| 4,233,282 | 11/1980 | Arendt | 423/598 |
| 4,234,436 | 11/1980 | Arendt et al. | 252/62.9 |
| 4,234,557 | 11/1980 | Arendt et al. | 423/593 |
| 4,234,558 | 11/1980 | Arendt et al. | 423/593 |
| 4,293,534 | 10/1981 | Arendt | 423/593 |
| 4,293,535 | 10/1981 | Arendt | 423/593 |
| 4,308,299 | 12/1981 | Arendt | 423/DIG. 12 |
| 4,374,117 | 2/1983 | Arendt | 423/593 |
| 4,487,755 | 12/1984 | Arendt | 423/593 |
| 4,534,956 | 8/1985 | Arendt et al. | 423/DIG. 12 |

FOREIGN PATENT DOCUMENTS

| | | |
|---|---|---|
| 58-135199 | 8/1983 | Japan . |
| 63-274619 | 11/1988 | Japan . |
| 1-100018 | 4/1989 | Japan . |
| 1-148796 | 6/1989 | Japan . |
| 1-275435 | 11/1989 | Japan . |
| 1-275492 | 11/1989 | Japan . |

OTHER PUBLICATIONS

Keszei et al., "Growth of BCSCO Single Crystals by a Slow-Cooling Flux Method", Journal of the Less-Common Metals, vol. 155, No. 2, pp. 229-234, Feb. 1989.
Chen et al., "Evaporation Kinetics of a Halide Flux System for the Growth . . . ", Journal of Crystal Growth, vol. 96, No. 3, pp. 547-551, 1989.
Katsui, "Crystal Growth of Superconducting Bi-Sr-Ca-Cu-O Compounds . . . ", Japanese Journal of Applied Physics, vol. 27, No. 5, pp. L844-845, May 1988.
Bosi et al., "Large Single Crystals of $YBa_2Cu_3O_{7-\delta}$ Superconductors from Chloride Fluxes", Journal of Material Science Letters, vol. 8, No. 5, pp. 497-500, May 1989.
Graebner et al, "Thermal Conductivity of Single-Crystal and Sintered . . . ", Materials Research Society Symposium Proceedings, vol. 99, 745-8, 12/4/87.
Holland et al., "Interplay of Synthesis, Structure, Microstructure, and . . . ", ACS Symposium Series 351, 103-113, 9/4/87.
Katsui et al (I), "Single Crystal Growth of $Ba(Pb,Bi)O_3$ from Molten . . . ", Japanese Journal of Applied Physics Part 2, vol. 21, No. 3, L157-8, Mar. 1982.
Katsui et al (II), "Solution Growth of Bi-Sr-Ca-Cu-O Compounds . . . ", Journal of Crystal Growth 91(3), 261-3, Aug. 1988.
Morris et al., "Preparation of High-Quality, Single Crystals of 90 . . . ", Materials Research Society Extended Abs., 43-6, Apr. 5-9, 1988.
Schneemeyer et al (I), "Superconductivity in $YBa_2Cu_3O_7$ Single Crystals", Nature, vol. 328, 601-3, Aug. 13, 1987.
Schneemeyer et al (II), "Growth of Superconducting Single Crystals . . . ", Nature, vol. 332, 422-4, Mar. 31, 1988.
van Dover et al., "Critical Current Densities in Single-Crystal . . . ", Appl. Phys. Lett., 52(22), 1910-2, May 30, 1988.

Primary Examiner—H. Dean
Assistant Examiner—David W. Schumaker
Attorney, Agent, or Firm—James Magee, Jr.; James C. Davis, Jr.

[57] ABSTRACT

A mixture comprised of an alkali chloride solvent and reactants comprised of oxides of lanthanum, an alkaline earth and copper, wherein the reactants are formulated to produce a superconducting reaction product, is heated to melt the chloride solvent in which the reactants then dissolve and react precipitating a lanthanum-alkaline earth-copper-oxygen superconductive material.

10 Claims, No Drawings

SYNTHESIS OF LANTHANUM-ALKALINE EARTH-COPPER-OXYGEN SUPERCONDUCTIVE MATERIAL

This application is a continuation of application Ser. No. 07/227,840, filed Aug. 3, 1988 abandoned.

The following U.S. patents are assigned to the assignee hereof and are incorporated herein by reference:

U.S. Pat. No. 4,201,760 to Arendt et al. for "Molten Salt Synthesis of Lithium Meta-Aluminate Powder" discloses a process of forming a mixture of alkali chloride solvent salt, a lithium salt reactant selected from the group consisting of lithium hydroxide, lithium nitrate, lithium carbonate and mixtures thereof, and an aluminum salt reactant selected from the group consisting of aluminum hydroxide, alpha-alumina, gamma-alumina and mixtures thereof and heating said mixture to melt the chloride salt solvent in which the lithium and aluminum salt reactants dissolve and react precipitating lithium meta-aluminate.

U.S. Ser. No. 010,747 filed Feb. 9, 1979 for Arendt et al. for "Magnesium Aluminum Spinel", now abandoned, discloses a process of forming a mixture of magnesium oxide, aluminum oxide and alkali chloride salt solvent and heating said mixture to melt the chloride salt solvent in which the magnesium oxide and aluminum oxide dissolve and react precipitating magnesium aluminate.

U.S. Ser. No. 011,100 filed Feb. 12, 1979 for Arendt et al. for "Magnesium Chrome Spinel", now abandoned, discloses a process of forming a mixture of magnesium oxide, chromium oxide and alkali chloride salt solvent and heating said mixture to melt the chloride salt solvent in which the magnesium oxide and chromium oxide dissolve and react precipitating magnesium chromite.

U.S. Pat. No. 4,234,558 to Arendt et al. for "Molten Salt Synthesis of Orthorhombic Lead Metaniobate Powder" discloses a process of forming a mixture of lead oxide, niobium pentoxide and alkali chloride salt solvent and heating said mixture to melt the chloride salt solvent in which the lead oxide and niobium pentoxide dissolve and react precipitating orthorhombic lead metaniobate.

U.S. Pat. No. 4,234,436 to Arendt et al. for "Molten Salt Synthesis of Modified Alkali Niobate Powders" discloses a process of forming a mixture of niobium pentoxide, an oxide of sodium, potassium, or mixtures thereof, an oxide of lead, cadmium or mixtures thereof, and alkali chloride salt solvent, and heating said mixture to melt the chloride salt solvent in which all of the oxides dissolve and react precipitating modified alkali niobate.

U.S. Pat. No. 4,234,557 to Arendt et al. for "Molten Salt Synthesis of Alkali Niobate Powders" discloses a process for forming a mixture of niobium pentoxide, an oxide of an alkali selected from the group consisting of sodium, potassium, lithium and mixtures thereof, and alkali chloride salt solvent, and heating said mixture to melt the chloride salt solvent in which the niobium oxide and alkali oxide dissolve and react precipitating the alkali niobate.

U.S. Pat. No. 4,233,282 to R. H. Arendt for "Molten Salt Synthesis of Barium and/or Strontium Titanate Powder" discloses a process of forming a particulate mixture of an alkali chloride solvent salt, titanium oxide and an alkaline earth reactant selected from the group consisting of barium oxide, strontium oxide, and mixtures thereof, and heating the mixture to melt the chloride salt solvent in which the titanium oxide and alkaline earth reactant dissolve and react precipitating a titanate selected from the group consisting of barium titanate, strontium titanate and mixtures thereof.

The present invention relates to the preparation of powdered oxide superconductive materials in the system lanthanum-alkaline earth-copper-oxygen.

The conventional preparation of these superconductive materials is either the solid-state reaction of an intimate mixture of the particulate oxides, or compounds which yield them on heating, or the co-precipitation of the cations in intimate mixture as some salt that yields the oxides on subsequent heating to facilitate compound formation. Both processes are in fact controlled by solid-state transport, the first being over far greater distances than the latter. This transport mechanism is relatively slow; it is, therefore, difficult to achieve complete reaction in finite times. The second procedure has the added penalty of requiring the processing of large volumes of aqueous solutions, which greatly increases the cost of preparing large quantities of material.

The present invention circumvents the inadequacies of the conventional processes by substituting for the solid state reaction, a liquid phase reaction scheme utilizing a molten salt solvent with subsequent precipitation of the product. In the present process, the reactants are slightly soluble in the molten salt solvent, therefore allowing literally atomic mixing in the liquid phase of the reactants. The solubilities of the reactants are such that they exceed the corresponding solubilities determined by the solubility product of the product in the molten salt solvent. Hence, the reaction product precipitates spontaneously from the molten salt solution. The reactants will continually dissolve to maintain a reactant-saturated solution until they are totally consumed by product formation. The product is separated from the cooled solidified mixture by dissolution of the chloride salt phase in water.

The present process is directed to producing a powder with a composition which makes it superconductive. This powder can be represented by the formula $La_{2-x}A_xCuO_{4+y}$ where A is an alkaline earth selected from the group consisting of strontium, barium and a combination thereof, where x ranges from about 0.1 to about 0.2 and where y ranges from 0 to about 0.2. Preferably, the alkaline earth is strontium. Also, preferably, x ranges from about 0.15 to about 0.2 and y ranges from about 0.1 to about 0.2. Preferably, the powder has a zero resistance transition temperature, i.e. a temperature at which there is no electrical resistance, of at least about 30 K, more preferably at least about 35 K, and most preferably at least about 38 K or as high as possible. Frequently, the powder has a zero resistance temperature ranging from about 30 K to about 38 K, or from about 35 K to about 38 K.

Briefly stated, the present process for producing the given $La_{2-x}A_xCu_{4+y}$ superconductive powder comprises providing particulate-lanthanum oxide or precursor therefor, providing particulate alkaline earth oxide selected from the group consisting of barium oxide, strontium oxide and a combination thereof or precursor therefor, providing particulate copper oxide or precursor therefor, said oxides or precursor therefor being formulated to produce said superconductive powder, providing an alkali chloride solvent selected from the group consisting of sodium chloride, potassium chloride and a combination thereof, forming a mixture of said oxides and/or precursor therefor and said alkali chloride solvent, heating said mixture to a reaction temperature at least sufficient to melt said chloride solvent, each said precursor decomposing at or below said reaction temperature to form said oxide and by-product gas, said alkali chloride solvent in molten form being a solvent for said oxides, maintaining said reaction temperature continuously dissolving said oxides and/or precursor therefor in the resulting molten chloride solvent and continuously reacting the oxides dissolved in said molten chloride solvent thereby precipitating said superconductive powder, said alkali chloride solvent being present in an amount at least sufficient to carry out the production of said superconductive powder, cooling the resulting reacted mass to solidify the molten chloride salt, adding water to the resulting solidified material dissolving the alkali chloride and recovering said precipitated superconductive powder.

In carrying out the present process, the reactant oxides are present in amounts which will produce the superconductive powder of desired composition and such amounts are determinable empirically. Preferably, the copper oxide is cupric oxide or substantially cupric oxide.

Alternatively, if desired, a particulate inorganic precursor of the reactant oxides can be used. The precursor should decompose at or below reaction temperature and may dissolve in the molten chloride solvent and decompose therein. The precursor should decompose completely to form the oxide and by-product gas or gases leaving no contaminants in the reacted mass. Representatives of the precursors of the reactant oxides useful in the present process are the carbonates, hydroxides and nitrates. The precursor should be used in an amount sufficient to produce the respective oxide in the desired amount. Preferably, the carbonate is used as the source of the alkaline earth oxide. Generally, at reaction temperature the alkaline earth carbonate along with any alkaline earth oxide formed by its partial decomposition, continuously dissolve in the molten chloride solvent where the carbonate decomposes to form the oxide.

The reactant oxides or precursors therefor should be of a size which allows the reaction to take place. Generally, these reactants or precursors therefor are used and are satisfactory in the particle size range in which they are available commercially, which ordinarily ranges from submicron up to about 100 microns. The reactant powders preferably also are free of large, hard aggregates, i.e. significantly above 100 microns in size, which might survive the mixing process and prevent sufficient reactant contact for satisfactory reaction rates.

In the present process the alkali chloride salt, i.e. solvent, is selected from the group consisting of sodium chloride, potassium chloride and a mixture thereof. The alkali chloride is used in an amount at least sufficient to carry out the production of the superconductive powder, i.e. an amount which in molten form is at least sufficient for the oxides to dissolve and react therein to precipitate the superconductive material. Such amount of alkali chloride is determined empirically. Generally, the alkali chloride is used in an amount of at least about 20% by weight, typically about 50% by weight, of the total amount of reactant oxides and alkali chloride. Generally, amounts of the alkali chloride lower than about 20% by weight are not practical since the desired reaction may not proceed. There is no upper critical maximum amount of chloride salt, but amounts of chloride salt higher than about 80% by weight of the total amount of reactant oxides and chloride salt solvent provide no significant advantage.

The reactants or precursors therefor and the alkali chloride salt solvent are admixed to produce a mixture which is sufficiently uniform to carry out the present reaction and precipitate the superconductive powder. Preferably, the mixture is substantially uniform to insure good contact and complete reaction. The actual mixing operation can be carried out in several conventional ways which do not introduce undesirable impurities into the resulting product. Preferably, water at room or ambient temperature is admixed with the reactant oxides or precursors therefor and the chloride salt solvent in an amount which, with stirring, is at least sufficient to form a slurry. The wet mixing can be carried out, for example, using a plastic milling medium or by wet mixing in a high speed blender with preferably distilled or deionized water, and preferably, with stainless steel or plastic stirrers, for example a propeller, in a stainless steel or plastic, preferably Teflon, lined vessel.

The reaction mixture can be contained in a conventional ceramic crucible which is stable in the present process such as alumina.

The mixture is heated to reaction temperature. The minimum reaction temperature is the temperature at which the chloride salt or salt mixture melts, i.e. the temperature at which it is molten. In molten form, the present chloride salt is a solvent for the reactant oxides. Preferably, the reaction temperature is at least about 10 K above the melting point, i.e. liquidus temperature, of the chloride solvent, since such higher temperature insures complete melting of chloride salt and also increases the fluidity of the molten salt producing increased wetting of the reaction mixture. The particular reaction temperature used depends largely on the chloride salt used and the reaction rate desired, i.e. rate of precipitation of the superconductive powder desired. Generally, the higher the reaction temperature, the faster is the reaction rate. For sodium chloride alone the melting point or liquidus temperature is about 1073 K (800° C.) whereas for potassium chloride alone it is about 1063 K (790° C.). All mixtures of sodium chloride and potassium chloride form a mixture which melts at a temperature below the melting point of sodium chloride alone and thus, for the eutectic mixture of 50 mole % potassium chloride—50 mole % sodium chloride the minimum reaction temperature is 931 K (658° C.). The maximum reaction temperature is always below the melting point of the superconductive powder being precipitated, and generally it is below about 1100° C. The reaction temperature should be kept below the temperature at which the chloride salt vaporizes significantly. Particularly preferred is a reaction temperature ranging from about 1073 K (800° C.) to about 1273 K(1000° C.) since it is not difficult to maintain and provides high reaction rates without significant vaporization of the molten salt solvent.

At reaction temperature the chloride salt melts and the reactant oxides dissolve and react in the molten salt precipitating the superconductive material. Preferably, the reaction temperature is maintained until the reaction of the reactants present is completed. The particular period of reaction time depends largely on reaction temperature as well as the amount of chloride salt used and is determinable empirically.

Preferably, the reaction temperature in the present process is that required to attain reasonable reaction rates in the molten salt solvent, but it can be significantly lower than in the corresponding conventional solid state synthesis. Similarly, the reaction time can be as short as about 30 minutes or shorter compared with several hours for solid state reaction. When the reaction is completed, the reaction mass is allowed to solidify. It is cooled at any convenient rate, preferably in air and preferably to about room temperature, i.e. a temperature generally ranging from about 20° C. to about 35° C.

The present process can be carried out in air at or about atmospheric pressure.

The cooled reacted mass is generally a solid cake comprised of particles of the superconductive composition distributed in a matrix of solidified chloride salt. The superconductive particles are present as distinct second phase crystallites generally embedded in the salt matrix. The resulting solidified material is disintegrated with water to yield the superconductive crystallites and an aqueous solution of the chloride salt. More specifically, water, preferably distilled or deionized to prevent introduction of impurities and preferably at room temperature, is added to the solid reacted mass in an amount at least sufficient to dissolve away the chloride salt content therefrom. The solubility of the present chloride salt is about 0.3 kilogram per liter of water at room temperature. This dissolution preferably is carried out in a plastic vessel, and as a practical matter with mixing to substantially shorten dissolution time, using, for example, a motor driven plastic or stainless steel stirrer. As the chloride salt dissolves, the mass disintegrates leaving the superconductive powder that generally contains no perceptibly agglomerated material, i.e. perceptible to the eye. The superconductive powder is then collected, washed and dried.

The superconductive powder can be recovered from the aqueous supernatant chloride solution by a number of conventional techniques. For example, the superconductive powder can be recovered by decanting the supernatant solution and drying the powder in air. The particular recovery technique depends on the impurities which may be present and on the purity required in the ceramic or other product fabricated from the powder. Preferably, the resulting slurry is mixed at room temperature in air for about 20 minutes. Mixing is then discontinued and a flocculating agent which is organic and soluble in water, preferably an anionic flocculant, is added in an amount which is sufficient to flocculate and settle the superconductive powder. After several washings and settlings, the wet powder is dried. Preferably, the flocculating agent is added in aqueous solution, about 0.1 gram of flocculant per 100 grams of water usually being satisfactory, and preferably the flocculating agent is used only in an amount necessary to settle the powder. For production of a superconductive powder of high purity, the flocculating agent should be completely removable by heating the powder in air at temperatures below the melting point of the powder and preferably not higher than about 1073 K (800° C.). Preferably, to remove any remaining water and flocculant, the powder is heated at about 773 K (500° C.) for about 20 minutes.

The present superconductive powder can be prepared free of impurities or free of significant impurities. Therefore, when the same procedure is used, its properties are reproducible from batch to batch.

Generally, the present superconductive powder is free-flowing. It may be in the form of aggregates, or in the form of individual powder crystals, or a mixture of both. Generally, the aggregates are comprised of a cluster of smaller sized crystals weakly bonded together autogeneously, i.e. such bonding is believed to be caused by Van der Waal's forces or by self-bonding, i.e. neck growth between grains. Generally, the individual grains have an average size ranging up to about 10 microns and frequently their average size is less than about 2 microns. The aggregates are friable and are readily broken down with very gentle comminution.

Conventional ceramic processing techniques can be used to form the present powder into a superconductive sintered body. Specifically, the present superconductive powder may be pressed into green bodies of desired size and shape and sintered in a known manner at temperatures below its melting point, generally ranging from about 950° C. to 1075° C. in oxygen or air at about atmospheric pressure to produce sintered bodies having a zero resistance temperature of at least about 30 K. Such sintered bodies would be useful as superconducting devices such as, for example, a magnetic shield at low temperatures.

The invention is further illustrated by the following example:

EXAMPLE 1

The reactants were formulated to produce a powder comprised of 0.900 $(La_2O_3)$-0.20SrO-$CuO_{1+y}$ or $La_{2-x}Sr_xCuO_{4+y}$ where x is about 0.2.

Reagent grade materials were used. The reactants as well as the chloride salt ranged in size up to about 100 microns 37.26 grams of $La_2O_3$, 3.75 grams of $SrCO_3$, 10.11 grams of CuO, 14.65 grams of NaCl and 18.69 grams of KCl were dry-milled for 30 minutes at room temperature in a liter polyethylene jar half-filled with $\frac{3}{8}''$ diameter dense zirconia cylinders. The chloride salt comprised 40% by weight of the total mixture. Also, the composition of the chloride salt was comprised of 50 mol % NaCl-KCl. The resulting intimate mixture was separated from the media and placed in a 500 ml dense alumina crucible and covered with a ceramic lid. The mixture was heated in air at 100 degrees C/hour to 1000° C., maintained at 1000° C. for four hours, then furnace cooled to room temperature. The resulting material was in the form of a dense black cake.

Distilled water was added at room temperature to the cake dissolving the chloride phase and disintegrating the cake into a fine black powder. The product powder was collected by filtration, washed with distilled water and dried in air.

The powder was in the form of substantially monodispersed small-sized crystallites wherein the crystallites appeared to have an average size of less than about 2 microns.

X-ray diffraction analysis of the product powder showed it to be phase pure with the desired tetragonal potassium-nickel fluoride structure, having lattice parameters of 3.7728 Angstroms and 13.2414 Angstroms. In distinction to the conventionally prepared materials, there were no extraneous lines present. Specifically, the product powder was comprised of $La_{1.8}Sr_{.2}CuO_{4+y}$. From past experience, it is known that y has a value ranging from 0 to about 0.2.

The superconductivity of the powder was determined by a conventional technique, i.e. the AC Susceptibility Technique. This technique comprised using the powder as an active element in a L-C resonance circuit and measuring the resonance frequency as a function of the circuit's temperature. The transition temperature is that at which there is a larger than background increase in the resonant frequency.

The powder was determined to have a zero resistance transition temperature of about 35 to 38 K.

What is claimed is:

1. A process of making a superconductive composition in polycrystalline powder form having the formula $La_{2-x}A_xCuO_{4-y}$, wherein A is strontium or barium, x is from about 0.1 to 0.2 and y is from 0 to about 0.2, which comprises forming an admixture comprising an alkali metal chloride solvent material selected from the group consisting of sodium chloride and potassium chloride, the oxide or oxide precursors of lanthanum and copper and an oxide or oxide precursor of at least one member of the group consisting of barium and strontium in amounts sufficient to produce the superconductive composition by reaction; heating the admixture to a temperature sufficient to melt the alkali metal chloride and at least partially dissolve the oxides of lanthanum, barium, strontium, and copper and form said superconductor composition; maintaining said temperature until the oxides are substantially consumed by formation of the superconductive composition; cooling the molten solvent material to a solid; separating and recovering the superconductive composition in powder by dissolving the alkali metal solvent material in water.

2. A process according to claim 1 for making, by precipitation from a molten chloride solvent, a superconductive composition in polycrystalline powder form having the formula $La_{2-x}A_xCuO_{4-y}$, wherein A is strontium or barium, x is from about 0.1 to 0.2 and y is from 0 to about 0.2, which comprises forming an admixture comprising an alkali metal chloride selected from the group consisting of sodium chloride and potassium chloride, lanthanum oxide, cupric oxide and member of the group consisting of barium carbonate and strontium carbonate, in amounts sufficient to produce the superconductive composition by reaction; heating the admixture to a temperature sufficient to melt the alkali metal chloride and at least partially dissolve the oxides of lanthanum, barium, strontium, and copper and form said superconductor composition; maintaining said temperature until the oxides are substantially consumed by formation of the superconductive composition; cooling the molten solvent material to a solid; separating and recovering the superconductive composition in powder form, from the alkali metal chloride by dissolving the chloride in water.

3. A process for making a superconductive composition in polycrystalline powder form having the formula $La_{2-x}A_xCuO_{4-y}$, wherein A is selected from the group consisting of strontium or barium, x is from about 0.1 to 0.2 and y is from 0 to about 0.2, which comprises forming an admixture comprising an alkali metal chloride selected from the group consisting of sodium chloride and potassium chloride, lanthanum oxide, a copper oxide, and at least one member of the member of the group consisting of barium oxide and strontium oxide, in amounts sufficient to produce the superconductive composition by reaction; heating the admixture to a temperature sufficient to melt the alkali metal chloride and dissolve the oxides of lanthanum, barium, strontium, and copper and form said superconductor composition; maintaining said temperature until the oxides are substantially consumed by formation of the superconductive composition; cooling the molten solvent material to a solid; separating the superconductive powder from the alkali metal chloride solvent material by dissolving the chloride solvent material in water.

4. The process according to claim 3 in which the admixture is heated to a temperature between about 800° C. and 1000° C.

5. The process according to claim 3 wherein the alkali metal chloride is an equi-molar mixture of sodium chloride and potassium chloride and the admixture is heated to a temperature between about 800° C. and 1000° C.

6. The process according to claim 3 wherein said alkaline earth oxide is barium oxide and barium carbonate is used as a precursor.

7. The process according to claim 3 wherein said alkaline earth oxide is strontium oxide and strontium carbonate is used as a precursor.

8. The process according to claim 3 wherein said oxide or precursor therefor ranges in particulate size up to about 100 microns.

9. The process according to claim 3 wherein in said formula x ranges from about 0.15 to about 0.2 and y ranges from about 0.1 to about 0.2.

10. The process according to claim 3 wherein said copper oxide is substantially cupric oxide.

* * * * *